US011268909B2

(12) United States Patent
Gao et al.

(10) Patent No.: US 11,268,909 B2
(45) Date of Patent: Mar. 8, 2022

(54) HEATSINK WITH VISUAL INSTALLATION INDICATOR

(71) Applicant: CISCO TECHNOLOGY, INC., San Jose, CA (US)

(72) Inventors: Le Gao, Shanghai (CN); Yang Sun, Hangzhou (CN); Rudong Shi, Shanghai (CN); Bruce Chen, Shanghai (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 656 days.

(21) Appl. No.: 16/167,724

(22) Filed: Oct. 23, 2018

(65) Prior Publication Data

US 2020/0124540 A1    Apr. 23, 2020

(51) Int. Cl.
| | | |
|---|---|---|
| *G01N 21/88* | (2006.01) | |
| *B23P 19/06* | (2006.01) | |
| *G01N 21/956* | (2006.01) | |
| *F16M 13/00* | (2006.01) | |

(52) U.S. Cl.
CPC .......... *G01N 21/8803* (2013.01); *B23P 19/06* (2013.01); *F16M 13/00* (2013.01); *G01N 21/956* (2013.01); *F28F 2275/10* (2013.01)

(58) Field of Classification Search
CPC .. G01N 21/8803; G01N 21/956; F16M 13/00; B23P 19/06; F28F 2275/10; F28F 2280/04; H01L 23/4006; F16B 1/0071; F16B 31/02
See application file for complete search history.

(56) References Cited

U.S. PATENT DOCUMENTS

| | | | | |
|---|---|---|---|---|
| 6,055,159 | A * | 4/2000 | Sun ...................... | H01L 23/4093 |
| | | | | 165/185 |
| 6,425,718 | B1 * | 7/2002 | Herr ...................... | F16B 31/028 |
| | | | | 411/10 |
| 9,210,827 | B2 | 12/2015 | Baeuml et al. | |
| 9,907,208 | B2 | 2/2018 | Bose et al. | |
| 10,557,493 | B1 * | 2/2020 | Hibbs ................... | F16B 5/0621 |
| 2008/0165501 | A1 * | 7/2008 | Stewart ............... | H01L 23/4006 |
| | | | | 361/704 |
| 2011/0255850 | A1 | 10/2011 | Dinh et al. | |

FOREIGN PATENT DOCUMENTS

EP          3081280 A1 * 10/2016 .............. F16L 45/00

* cited by examiner

*Primary Examiner* — Lee A Holly (57) ABSTRACT

In one embodiment, an apparatus includes a module for use in installing a heatsink, the module comprising a fastener, a first indicator member comprising a first visual indicator surface, and a second indicator member comprising a second visual indicator surface, the first and second indicator members defining an opening for receiving the fastener. The first visual indicator surface is visible when the fastener is not fully installed and the second visual indicator surface is visible when the fastener is fully installed. A method for installing the heatsink with the module is also disclosed herein.

20 Claims, 13 Drawing Sheets

HEATSINK WITH VISUAL INSTALLATION INDICATOR

TECHNICAL FIELD

The present disclosure relates generally to heatsinks, and more particularly, to heatsink installation.

BACKGROUND

Over the past several years, there has been a tremendous increase in the need for higher performance communications networks. Increased performance requirements have led to an increase in energy use resulting in greater heat dissipation from components. Heatsinks are widely used to accommodate the large thermal dissipation of many semiconductor devices (e.g., CPU (Central Processing Unit), GPU (Graphical Processing Unit), and ASIC (Applicant Specific Integrated Circuit). Heatsink installation typically involves the use of screws, clips, or other mechanisms.

BRIEF DESCRIPTION OF THE DRAWINGS

Corresponding reference characters indicate corresponding parts throughout the several views of the drawings.

DESCRIPTION OF EXAMPLE EMBODIMENTS

Overview

In one embodiment, an apparatus generally comprises a module for use in installing a heatsink, the module comprising a fastener, a first indicator member comprising a first visual indicator surface, and a second indicator member comprising a second visual indicator surface, the first and second indicator members defining an opening for receiving the fastener. The first visual indicator surface is visible when the fastener is not fully installed and the second visual indicator surface is visible when the fastener is fully installed.

In another embodiment, an apparatus generally comprises a heatsink and a plurality of modules attached to the heatsink for installation of the heatsink. Each of the modules generally comprises a fastener, a first indicator member comprising a first visual indicator surface, and a second indicator member comprising a second visual indicator surface. The first visual indicator surface is visible when the fastener is not fully installed and the second visual indicator surface is visible when the fastener is fully installed.

In yet another embodiment, a method for installing a heatsink generally comprises installing the heatsink with a fastener located within a module attached to the heatsink, the module comprising at least one visual indicator indicating an installation state of the fastener, the visual indicator positioned circumferentially around at least a portion of the fastener, and receiving a visual indication indicating that the fastener is properly installed.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as server systems include many semiconductor chips, which often use heatsinks to dissipate thermal energy generated by the chips. Based on different pressure requirements for various types of semiconductor chips, there are different ways in which the heatsinks may be installed, including, for example, the use of thermal epoxies, Z-clips, pushpins, and spring screws. For large chips (e.g., CPU (Central Processing Unit), GPU (Graphical Processing Unit)), a threaded screw and compression spring may be used for heatsink installation, for example.

A problem with conventional fastener attachment is that there is no effective way to detect whether or not the fasteners are fully and properly installed. If the heatsink is not properly installed, the chip may also not be properly installed since chips often depend on the pressure exerted from the force of the heatsink attachment fastener (e.g., compression spring) for proper installation. In one example, the processor and heatsink may be assembled and installed together as a PHM (Processor Heatsink Module), which is then installed onto a socket on a PCB (Printed Circuit Board). To ensure proper pin contact between the processor and socket, sufficient pressure needs to be generated by fully fastening attachment screws of the heatsink. However, conventional fastener designs do not provide for detection of proper installation, which may result in the heatsink attachment fasteners not being properly installed. This may lead to system error issues when the system is brought up or tested.

Another issue is that it is difficult to judge the heatsink fastener condition (fastened or unfastened) directly without using a screw driver or other tool to test each fastener on the heatsink. If the heatsink is not properly installed (e.g., with fully torqued screws or other fasteners in place), the heatsink may fall off during shipping and damage the printed circuit board or other components. Improper installation of the heatsink may also lead to overheating of the electronic component, thereby impacting network device performance, reliability, and potentially limiting the life of the product.

The embodiments described herein provide a visual indication of the installation state (condition) of each heatsink fastener through the use of mechanical components. The embodiments allow for visual detection of each fastener installation to prevent heatsink modules from being installed or delivered without all of the fasteners properly installed, thereby improving the quality and stability of the system in which the heatsink module is installed and improving system performance. An installation indicator module in accordance with one or more embodiments provides a visual indication of the installation status of the fastener (e.g., not fully/properly installed or fully/properly installed) in a compact arrangement that does not require a significant amount of space within the processor and heatsink assembly. In one or more embodiments, the installation indicator module is configured for use in fastening the heatsink, provides sufficient spring compression force to a semiconductor device (processor), provides a visual indication that the fastener is not fully (properly) installed, and provides a visual indication that the fastener is fully (properly) installed. When all of the fasteners are fully installed, sufficient compression force is applied to securely hold the heatsink in place. In one or more embodiments, the installation indicator module comprises only plastic and metal parts and does not require any sensors or electrical components or additional tools to detect the heatsink installation state. In one or more embodiments, optical inspection may be performed with an optical sensor configured to detect the condition of the fastener installation based on the visual indication provided by the installation indicator module to automate the installation detection process.

The installation indicator module may comprise any type of fastener operable to securely fasten the processor and heatsink assembly to a printed circuit board or other structure. The fastener may comprise, for example, a spring loaded screw, pushpin, or other fastener configured to provide sufficient force to securely hold the heatsink assembly in place. In one embodiment described below with respect to FIGS. 1-8C, the fastener comprises a spring loaded screw. In another embodiment described below with respect to FIGS. 10-13B, the fastener comprises a spring loaded pushpin. It is to be understood that these fasteners are only examples and that other mechanisms may be used with the installation indicator module described herein to provide a visual indication of the heatsink installation state.

Figure 1:
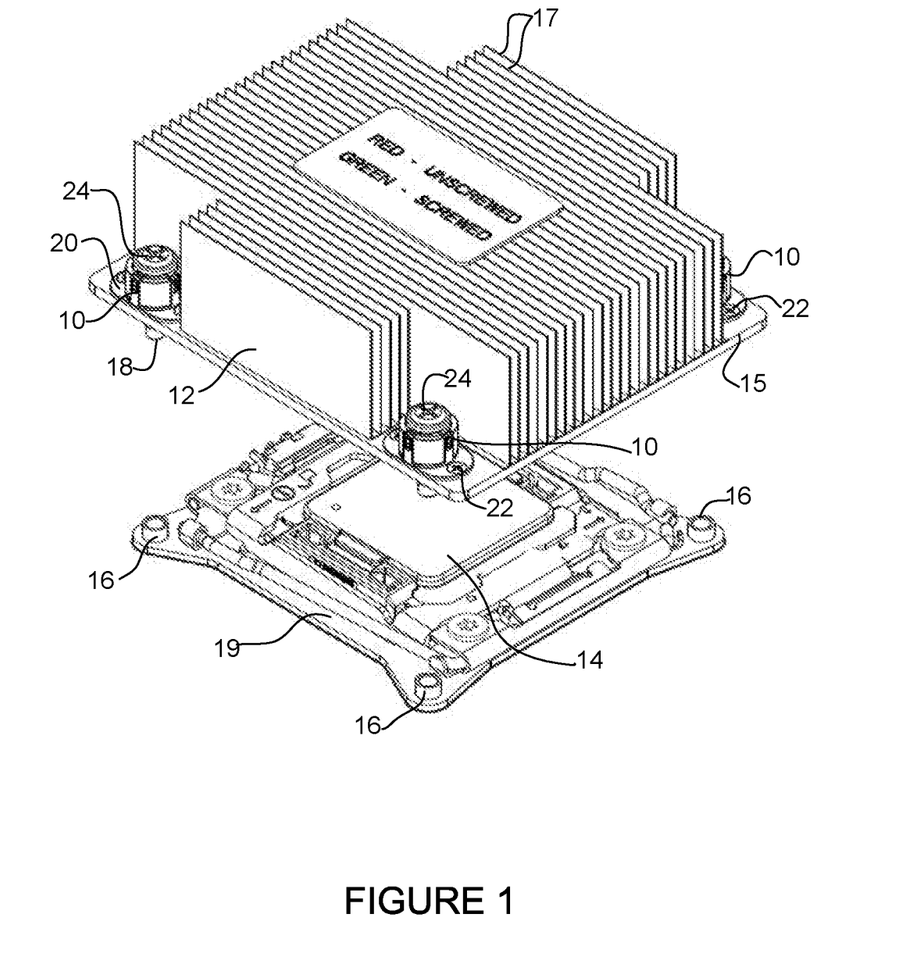
FIG. 1 is an exploded view of a processor and heatsink assembly with installation indicator modules comprising spring loaded screws, in accordance with one embodiment.

Referring now to the drawings, and first to FIG. 1, an exploded view of one example of a processor and heatsink assembly with installation indicator spring screw modules 10 is shown, in accordance with one embodiment. In the example shown in FIG. 1, a heatsink 12 is attached to an electronic component (e.g., chip) 14 on a processor base 19. The heatsink 12 is configured to maximize the surface area in contact with a cooling medium (e.g., air) surrounding the heatsink. The heatsink 12 transfers heat generated by the electronic component 14 where heat dissipation capability of the component is insufficient to moderate its temperature. The heatsink 12 comprises a base 15 and fins 17, which allow excess thermal energy to dissipate into the environment by conduction and convection. The heatsink 12 may be formed from any suitable material (e.g., copper, aluminum) and have any shape (e.g., any height, width, length, base footprint, base thickness, number or size of fins). The electronic component (processor, chip) 14 may comprise, for example, a CPU, GPU, or other electronic component that generates thermal energy. The processor and heatsink assembly is installed on a printed circuit board, as described below with respect to FIGS. 5A and 8A.

The processor and heatsink assembly may operate on any type of network device (e.g., router, switch, server, workstation, gateway, controller, edge device, access device, aggregation device, core node, intermediate node, or other network device). The network device may comprise any number of processor and heatsink modules and operate in the context of a data communications network including multiple network devices.

As shown in the example of FIG. 1, the heatsink 12 includes a cutout at each corner to provide sufficient space for installation of the spring screw modules 10. A threaded portion 18 of a screw 24 of the module 10 is received in opening 16 located at each corner of the base 19. The installation indicator spring screw module 10 is attached to the heatsink 12 with screws 22 that extend through openings in a base 20 of the module.

It is to be understood that the heatsink and processor assembly described above and shown in FIG. 1 is only an example and that the installation indicator spring screw module 10 described herein may be used to install other types of heatsinks or other components on a printed circuit board, without departing from the scope of the embodiments. Also, the location of the installation indicator spring screw modules 10 and the number of modules used to fasten the heatsink may be different than shown in FIG. 1, without departing from the scope of the embodiments.

Figure 2:
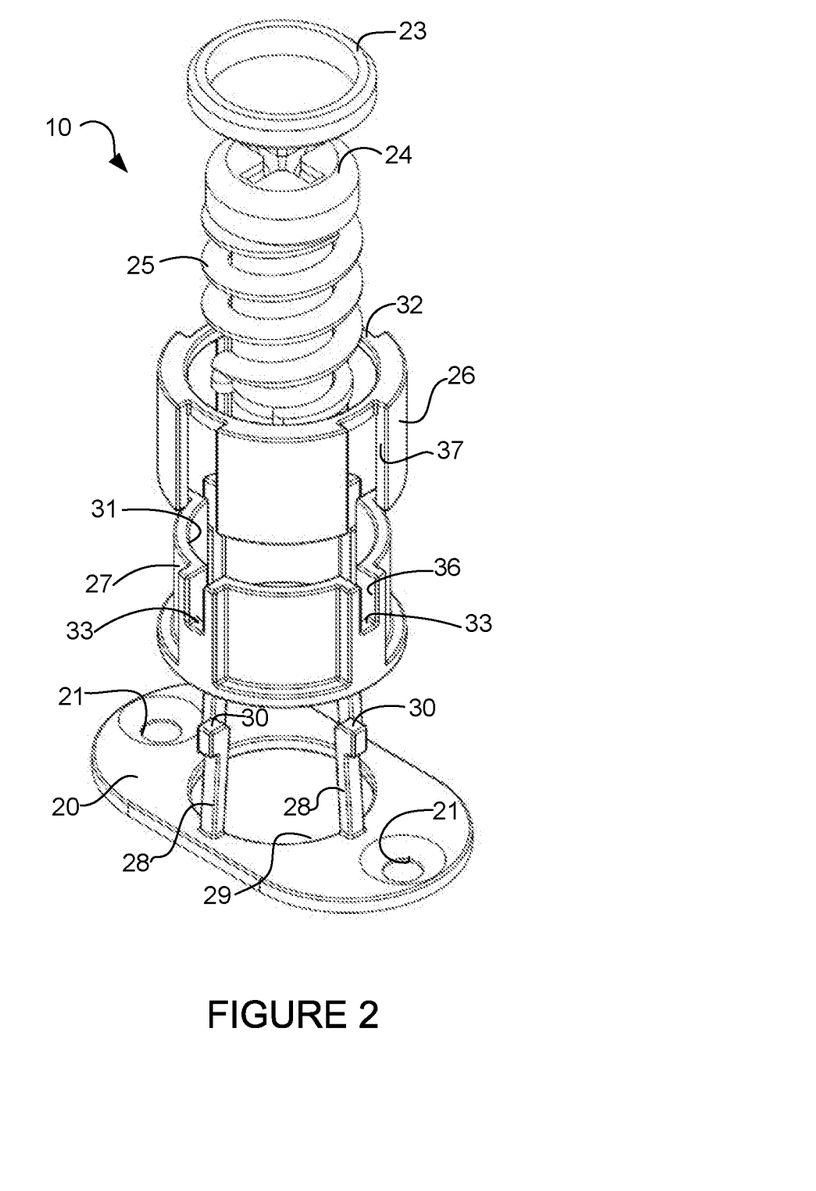
FIG. 2 is an exploded view of the installation indicator spring screw module of FIG. 1.

Details of the installation indicator spring screw module 10 are shown in an exploded view in FIG. 2, in accordance with one embodiment. The module 10 comprises the base 20 having openings 21 for mounting the module on the base 15 of the heatsink 12 (FIGS. 1 and 2). The module 10 may be attached to the heatsink 12 with screws 22 received in openings 21 or any other suitable fastener. The module 10 generally comprises a spring loaded screw 24, a first indicator member (indicator sleeve 27) comprising a first visual indicator surface 33 and a second indicator member (indicator pins 28) comprising a second visual indicator surface 30. The first and second indicator members define an opening 31 for receiving the spring loaded screw. The first visual indicator surface 33 is visible when the spring loaded screw 24 is not fully tightened and the second visual indicator surface 30 is visible when the spring loaded screw is fully tightened. As described below, the visual indicators (visual indicator surfaces 30, 33) are positioned circumferentially around at least a portion of the screw 24. In one or more embodiments, four visual indicator surfaces may be positioned adjacent to an outer circumference of the screw head and visible from a top view of the module 10. In one or more embodiments, the first and second visual indicator surfaces are different colors and only one of the first and second visual indicator surfaces is visible at a time from a top view of the spring loaded screw. The installation state of the screw (fully tightened or not fully tightened) is easily identified based on which visual indicator surface is visible (e.g., green surface indicates fully tightened and red surface indicates not fully tightened).

Referring again to FIG. 2, in one or more embodiments, the module 10 comprises an outer ring 23, the screw 24 for fastening the heatsink 12, a spring 25 for providing a suitable compression force, an outer sleeve 26, an indicator sleeve 27 (first installation indicator member), and indicator pins 28 (second installation indicator members) connected to the module base 20. The indicator pins 28 extend upward from the base 20 and form an inner sleeve received within indicator sleeve 27. The indicator pins 28 may be formed from plastic or other suitably resilient material that allows the pins (arms, claws) to move outward when the screw 24 is fully tightened and the outer ring 23 is forced into contact with the pins, as described in detail below.

In the example shown in FIG. 2, the module 10 comprises four pins 28 located around the periphery of a central opening 29 within the base 20 for receiving the threaded portion of the screw 24. A top surface 30 of each indicator pin 28 provides a visual indication when the screw 24 is fully tightened. In one example, the top surface (second visual indicator surface) 30 of each pin 28 is colored green to indicate proper installation. The indicator pins 28 are normally angled slightly inward so that the green top surface 30 of the indicator pin 28 is hidden from view by an upper surface 32 of the outer sleeve 26 when the screw is not fully installed, as described below with respect to FIGS. 3, 4A, 4B, 5A, and 5B. When the screw 24 is fully installed (properly tightened, torqued) the indicator pins 28 are forced outward as the outer ring 23 is pushed downward against the indicator pins so that the green surface 30 is visible, as described below with respect to FIGS. 6, 7A, 7B, 8A, 8B, and 8C. It is to be understood that the configuration of the indicator pins 28 (e.g., number, shape, and arrangement of the pins) and the indication provided (e.g., green color) is only an example and that other types of indicator elements or visual indication may be used.

The indicator pins 28 are received within the indicator sleeve 27 at the location of four slots 36 spaced around a circumference of the indicator sleeve. A lower edge 33 of each slot 36 of the indicator sleeve 27 comprises a visual indicator (e.g., red surface) that is visible from a top view of the module when the screw 24 is not properly installed. The red surface 33 (lower surface of slot 36) is received in a notched section 37 of outer sleeve 26. The red surface (first visual indicator surface) 33 is blocked as viewed from a top of the module 10, by the green surface 30 of the indicator pin 28 when the screw 24 is properly tightened. If the screw 24 is not fully tightened, the red indicator color on the surface 33 of the indicator sleeve 27 is visible as viewed from the top of the screw, thereby indicating to a technician that the screw needs to be tightened. When the screw 24 is fully tightened and properly installed, the red indicator color on surface 33 of the indicator sleeve 27 is hidden and the green indicator color on surface 30 of the indicator pin 28 is visible to provide a visual indication that the screw has been fully tightened and properly installed.

As previously described, a green color indicates that the screw 24 is properly installed and a red color indicates that the screw is not fully installed. It is to be understood that this visual indication is only an example and other visual indicators may be used (e.g., different colors or graphics/images). Also, the example shown in FIG. 2 and described herein provides both an indication that the screw is not fully tightened and an indication that the screw is fully tightened. In one or more other embodiments, only one indication may be provided (e.g., red color to indicate that the screw is not fully installed or green color to indicate that the screw is fully installed).

Details of the installation indicator spring screw module 10 configuration when the screw is not properly installed are described below with respect to FIGS. 3, 4A, 4B, 5A, and 5B, followed by a detailed description of installation indicator spring screw module 10 configuration when the screw is properly installed with respect to FIGS. 6, 7A, 7B, 8A, 8B, and 8C.

Figure 3:
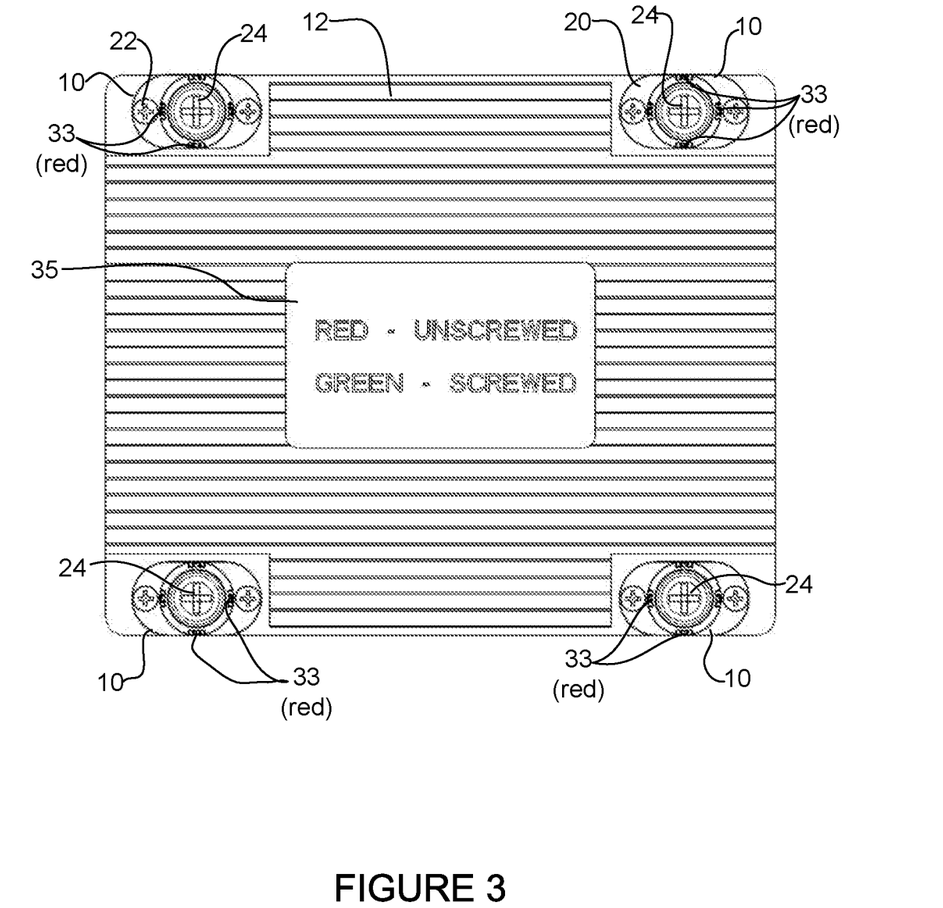
FIG. 3 is a top view of the processor and heatsink assembly of FIG. 1 with screws of the installation indicator spring screw modules not fully installed.

FIG. 3 is a top view of the heatsink 12 with all of the screws 24 not fully tightened. The four installation indicator spring screw modules 10 are located at each corner of the assembly, as described above with respect to FIG. 1. In this example, each of the screws 24 is not fully tightened and the red surface 33 of the indicator sleeve 27 (FIGS. 2 and 3) is visible as viewed from the top of the heatsink 12. The heatsink 12 includes a plate 35 with a key for the color coded modules 10. As shown FIG. 3, RED indicates UNSCREWED (i.e., screw is not fully/properly tightened/installed) and GREEN indicates SCREWED (i.e., screw is fully/properly tightened/installed). In this example, all four screws 24 are not fully tightened, however, it should be noted that not all screws may be in the same state. For example, only some (e.g., one, two, or three) of the screws 24 may not be fully tightened, while the remaining screws are fully tightened. A user may easily be able to identify which screws need to be tightened by identifying the modules with visible red surfaces. It is to be understood that the plate 35 shown in FIG. 3 is only an example and other identifiers or instructions may be provided, or no description of the visual indicator may be provided.

Figure 4A:
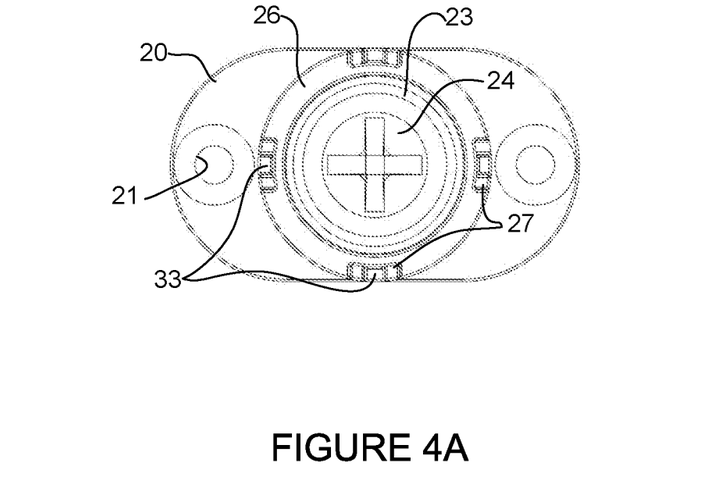
FIG. 4A is a top view of one of the installation indicator spring screw modules of FIG. 3.
Figure 4B:
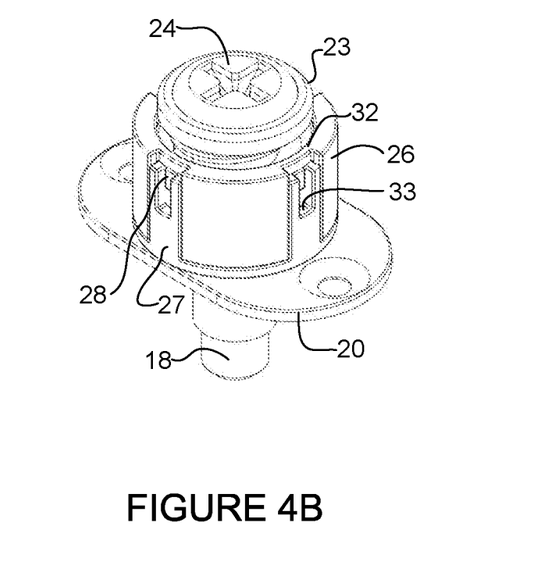
FIG. 4B is a perspective of the installation indicator spring screw module of FIG. 4A.

FIG. 4A is a top view and FIG. 4B is a perspective showing details of the indicator spring screw module 10 of FIG. 3. As previously noted with respect to FIG. 3, the screw 24 is not fully tightened and the red surface 33 on the indicator sleeve 27 is visible as viewed from the top. The green surface of the indicator pin 28 is hidden from view by the upper surface 32 of the outer sleeve 26.

Figure 5A:
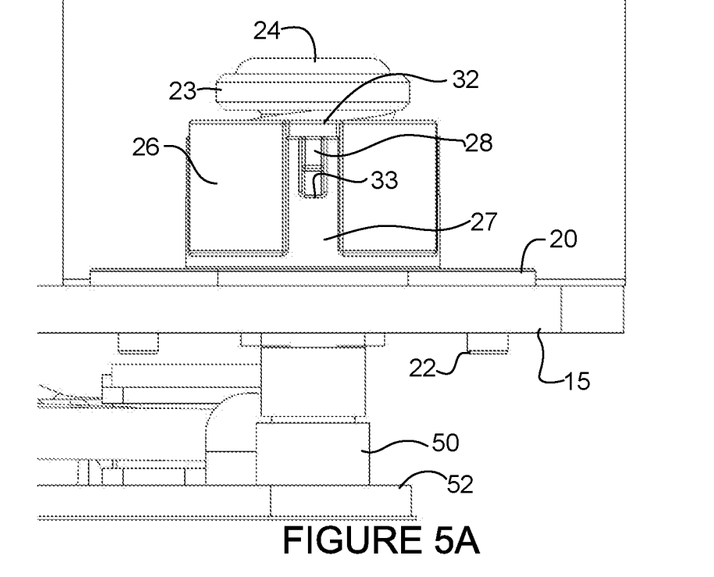
FIG. 5A is a side view of one of the installation indicator spring screw modules in the processor and heatsink assembly shown in FIG. 3.

FIG. 5A is a partial side view of the installation indicator spring screw module 10 installed in the processor and heatsink assembly, which is mounted on a printed circuit board 52 at standoff 50. As previously described, the installation indicator screw module 10 is mounted on the heatsink base 15 with screws 22 extending through openings in base 20 of the module. In this example, the screw 24 is not fully tightened, thus the outer ring 23 is spaced from the outer sleeve 26 and indicator pins 28. The indicator pin 28 is in its unloaded (inward) position and covered from top view by the upper surface 32 of outer sleeve 26, which allows red surface 33 of the indicator sleeve 27 to be visible.

Figure 5B:
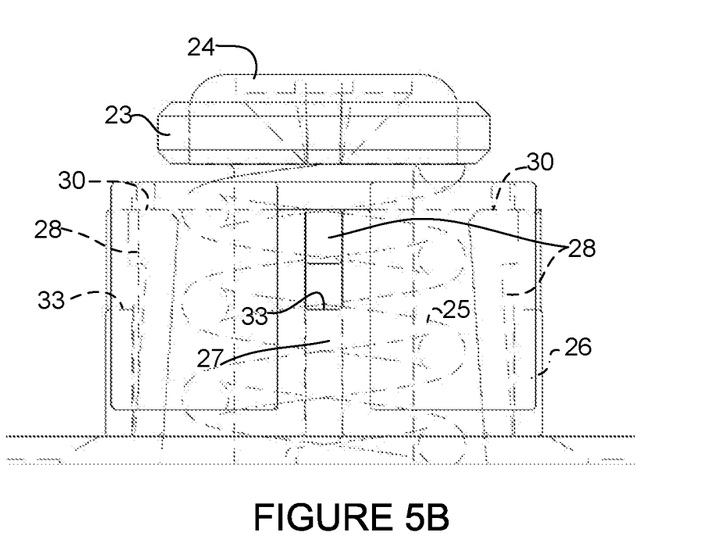
FIG. 5B is the installation indicator spring screw module of FIG. 5A with parts shown in phantom to illustrate additional details of the module.

FIG. 5B is a side view of the installation indicator spring screw module 10 with the outer sleeve 26 in phantom to show the location of the indicator pins 28. When the screw 24 is not fully tightened, the outer ring 23 is spaced from the indicator pins 28, which are in their normal unbiased position with their upper green surface 30 tucked beneath the upper surface 32 of the outer sleeve 26 at notched area 37 (FIGS. 2 and 5B). The red surface 33 of the indicator sleeve 27 is therefore visible as viewed from the top of the module 10, as shown in FIG. 4A.

Figure 6:
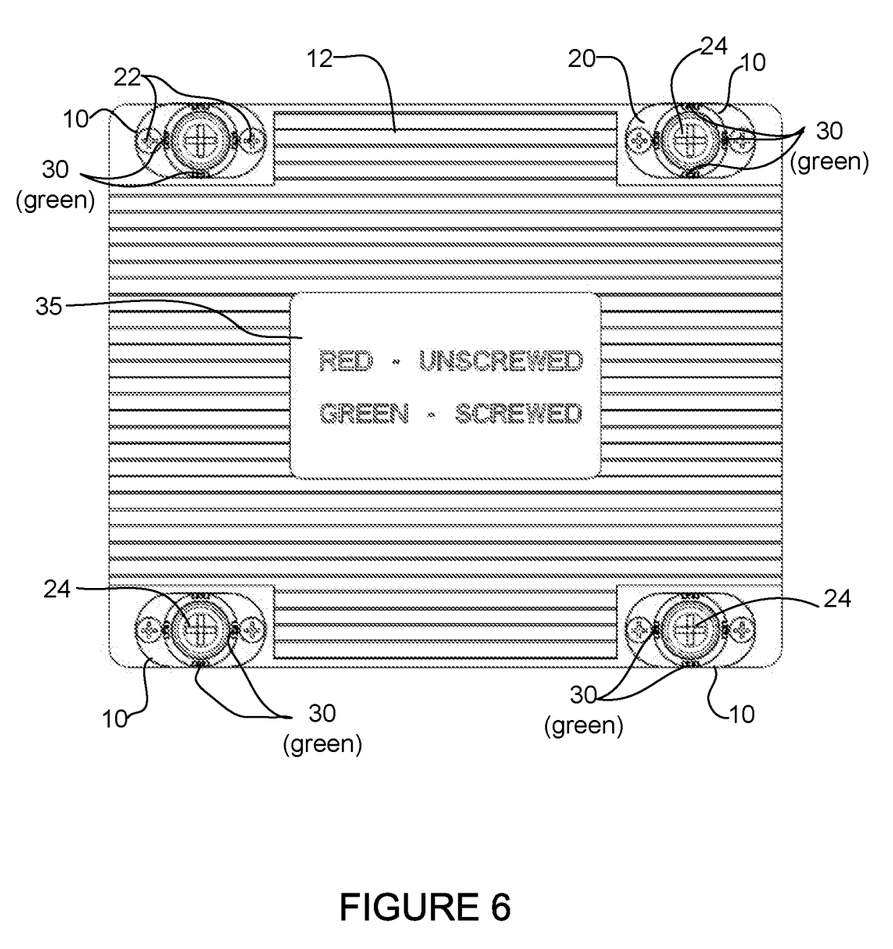
FIG. 6 is a top view of the processor and heatsink assembly of FIG. 1 with screws of the installation indicator spring screw modules fully installed.

FIG. 6 is a top view of the heatsink 12 with the screws 24 of the installation indicator spring screw modules 10 all properly tightened, with the green surfaces 30 of the indicator pins 28 visible at the modules 10.

Figure 7A:
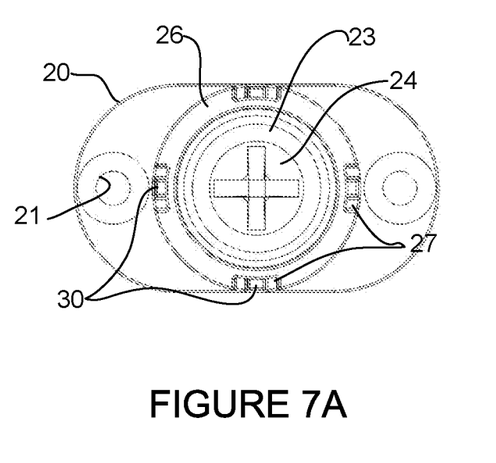
FIG. 7A is a top view of one of the installation indicator spring screw modules of FIG. 6.
Figure 7B:
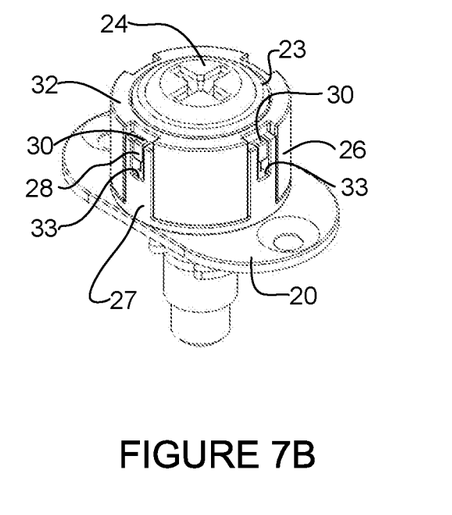
FIG. 7B is a perspective of the installation indicator spring screw module of FIG. 7A.

FIGS. 7A and 7B illustrate details of the installation indicator module 10 with the screw 24 in its fully installed position. As shown in FIG. 7A, the green upper surface 30 of each indicator pin is visible in the top view. When the screw 24 is properly tightened, the outer ring 23 contacts the indicator pins 28 and forces the pins outward, thereby revealing the green top surface 30 which is pushed radially outward and beyond the notched upper surface 32 of the outer sleeve 26 (FIG. 7B). The red surface 33 of the indicator sleeve 27 is now hidden (as viewed from the top) by the indicator pin 28.

Figure 8A:
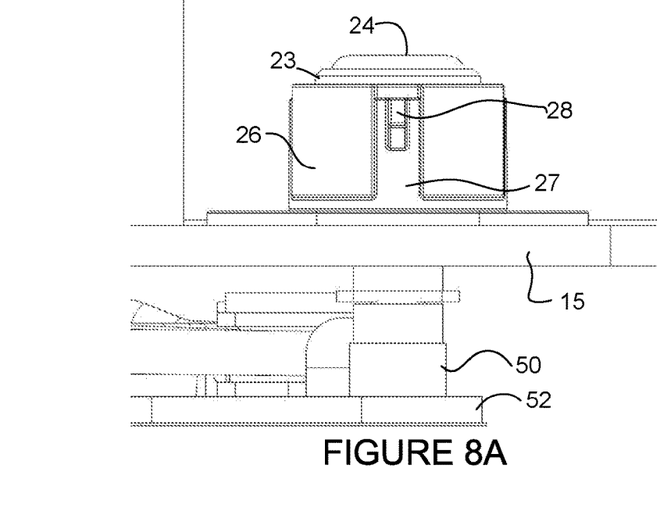
FIG. 8A is a side view of one of the installation indicator spring screw modules in the processor and heatsink assembly shown in FIG. 6.
Figure 8B:
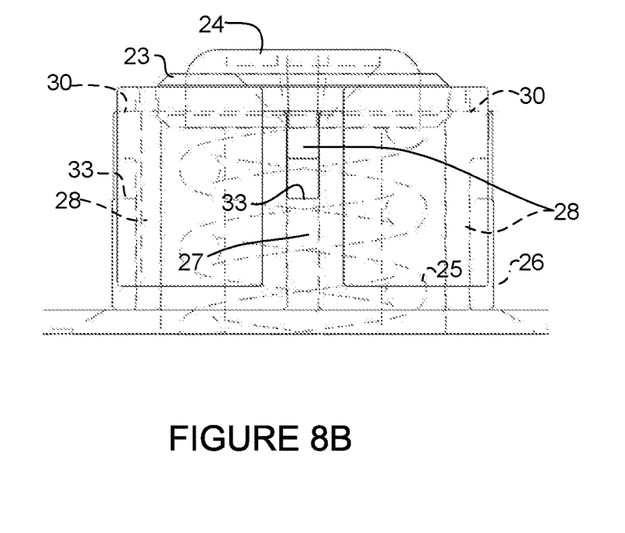
FIG. 8B is the installation indicator spring screw module of FIG. 8A with parts shown in phantom to illustrate additional details of the module.
Figure 8C:
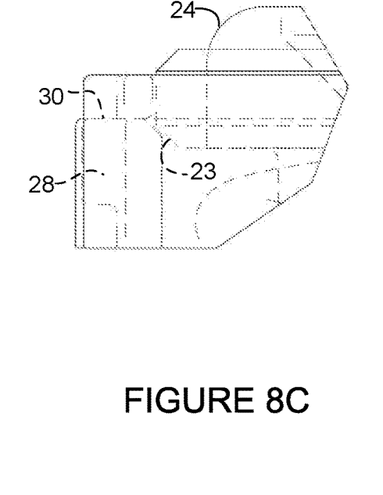
FIG. 8C is an enlarged view of a portion of the installation indicator spring screw module of FIG. 8B showing detail of an outer ring and indicator pin interface.

FIGS. 8A, 8B, and 8C show additional detail of the installation indicator spring screw module 10 with the screw 24 in its fully tightened position. FIG. 8A is a side view showing the processor and heatsink assembly attached to the printed circuit board 52 at standoff 50. The outer sleeve 26 is in phantom in FIG. 8B to show the position of the indicator pins 28 and an enlarged view of the indicator pin and outer ring 23 interface is shown in FIG. 8C. As the screw 24 is tightened it forces the outer ring 23 downward and into contact with the indicator pins 28, which are forced radially outward by the outer ring. The upper green surfaces 30 of the indicator pins 28 are now visible as viewed from the top since they extend beyond the upper surface 32 of the outer sleeve 26 at the notched portion 37 of the outer sleeve (FIGS. 2, 8B and 8C). When the indicator pin 28 is in its spring loaded position (pushed radially outward), it blocks the red upper surface 33 of the indicator sleeve 27 (FIG. 8B).

When the screw 24 is loosened and the outer ring 23 moves away from the indicator pins 28 (FIG. 5B), the resilient indicator pins spring back inward to their original unloaded position and the red surface 33 of the indicator sleeve 27 is once again visible to indicate that the screw has been loosened.

Figure 9:
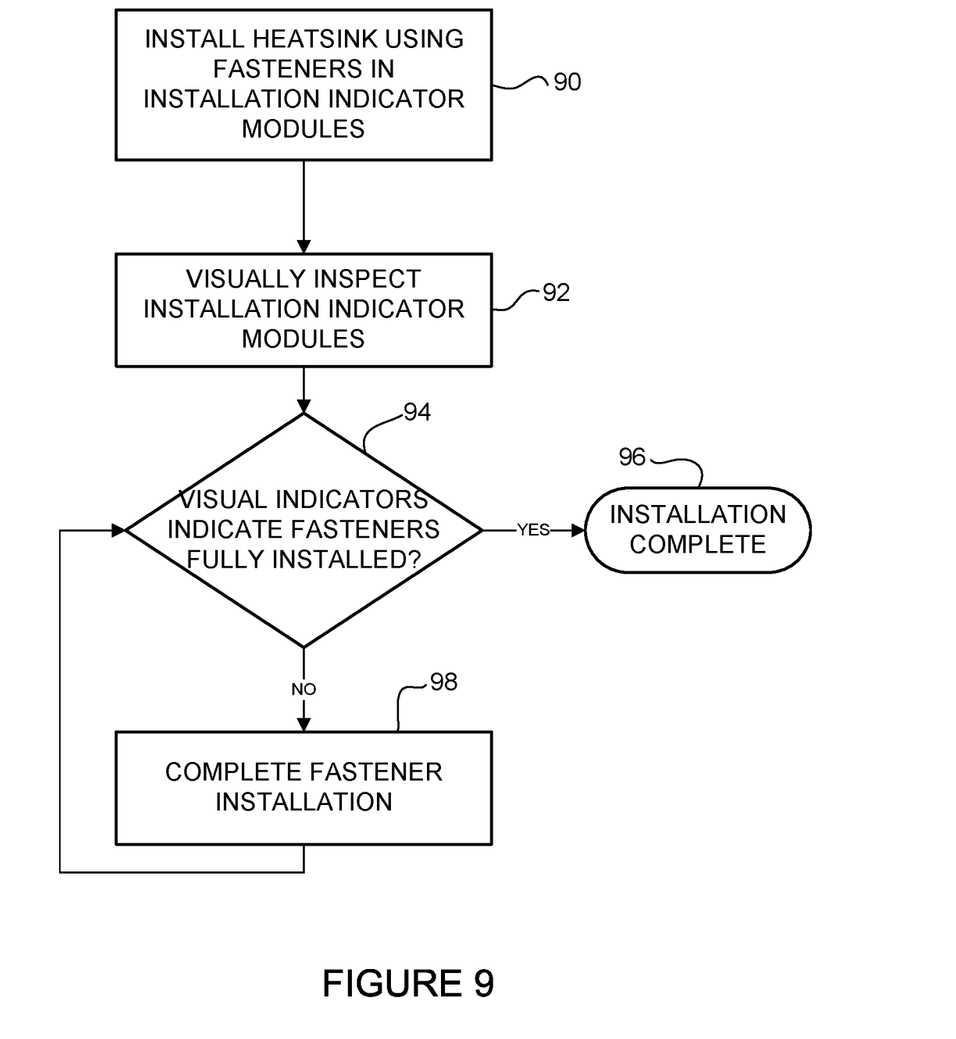
FIG. 9 is a flowchart illustrating an overview of a heatsink installation process with the installation indicator modules, in accordance with one embodiment.

FIG. 9 is a flowchart illustrating an overview of a process for visual detection of installation state of the fastener of the installation indicator module, in accordance with one embodiment. At step 90, the fasteners are used to install the heatsink. The installation indicator modules are visually inspected and indicate if the fastener is fully and properly installed (step 92). This may involve viewing the module 10 from above, or any other viewpoint, and seeing if the module shows a green or red visual indication. This step may also be automated with the use of an optical inspection tool, for example. If the visual indicator identifies the fasteners as being properly installed (e.g., green surface 30 visible) (FIGS. 6 and 9), the installation is complete (steps 94 and 96). If the visual indicator identifies one or more of the fasteners as not being fully installed (e.g., red surface 33 visible) (FIGS. 3 and 9), the fastener (or fasteners) are tightened (step 98) and step 94 is repeated.

It is to be understood that the process shown in FIG. 9 is only an example and steps may be combined, modified, or added without departing from the scope of the embodiments.

Figure 10:
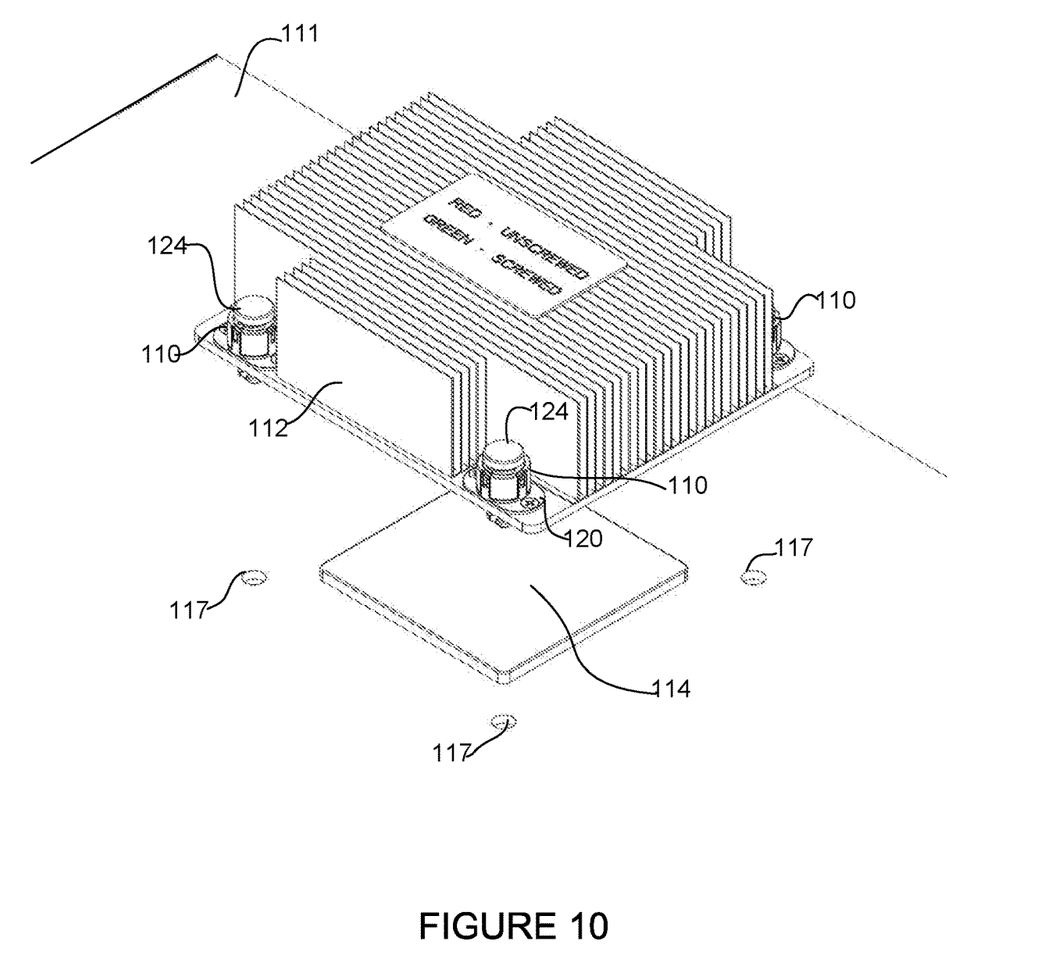
FIG. 10 is an exploded view of the heatsink assembly with installation indicator modules comprising pushpins, in accordance with one embodiment.

FIG. 10 is an exploded view of the processor and heatsink assembly with installation indicator pushpin modules 110. In the example shown in FIG. 10, the heatsink 112 is configured for attachment to a structure (e.g., printed circuit board) 111 with an electronic component (e.g., chip) 114 interposed between the structure and heatsink. The printed circuit board comprises openings 117 for receiving spring loaded arms of the fastener 124, as described below.

Figure 11:
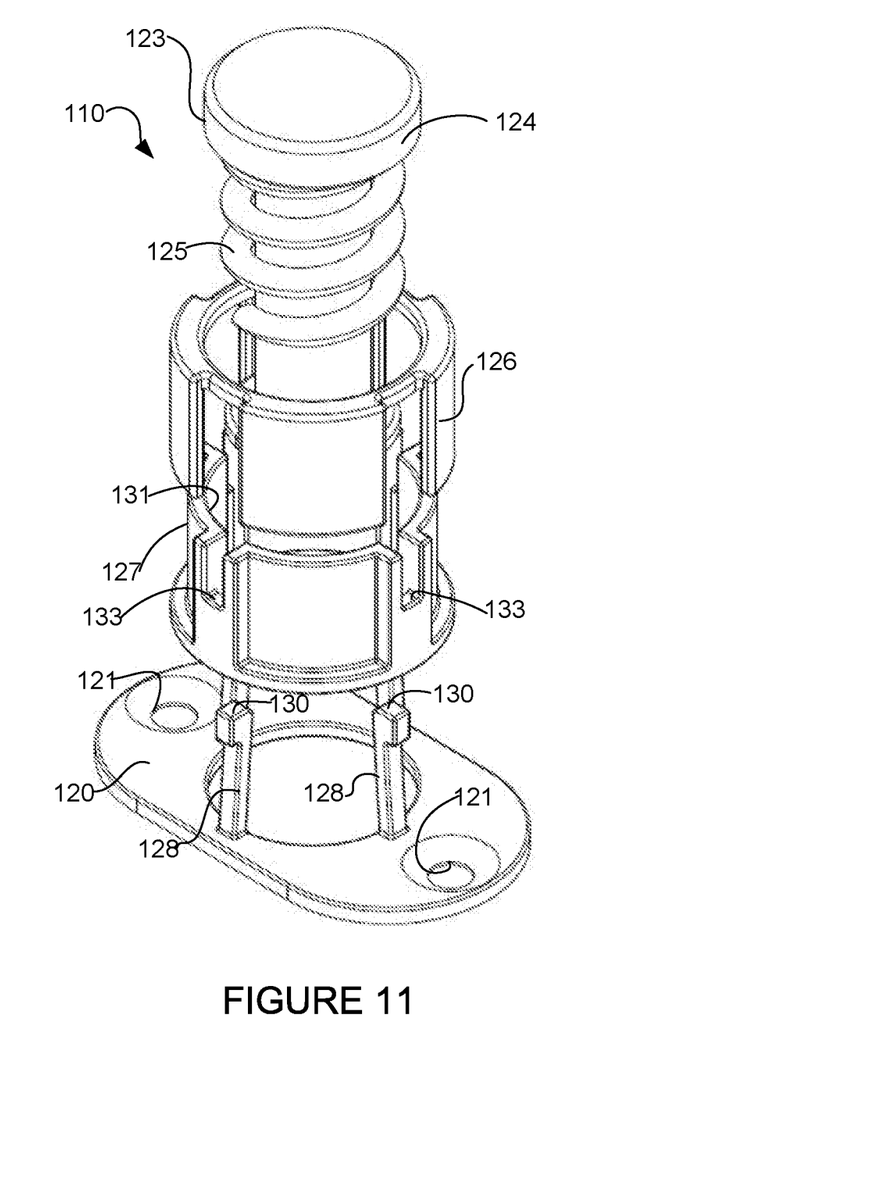
FIG. 11 is an exploded view of the installation indicator pushpin module of FIG. 10.

Details of the installation indicator pushpin module 110 are shown in an exploded view in FIG. 11, in accordance with one embodiment. The module 110 comprises a base 120 having openings 121 for mounting the module on the base of the heatsink 120 (FIGS. 10 and 11). The module 110 generally comprises a spring loaded pushpin 124, a first indicator member (indicator sleeve 127) comprising a first visual indicator surface 133 and a second indicator member (indicator pins 128) comprising a second visual indicator surface 130. The first and second indicator members define an opening 131 for receiving the spring loaded pushpin 124. The first visual indicator surface 133 is visible when the spring loaded pushpin 124 is not fully inserted and the second visual indicator surface 130 is visible when the pushpin is fully inserted, as described above for the installation indicator spring screw module 10. The visual indicators (visual indicator surfaces 130, 133) are positioned circumferentially around at least a portion of the pushpin 124.

In one or more embodiments, the module 110 comprises the pushpin 124, a spring 125 for providing a suitable compression force, an outer sleeve 126, the indicator sleeve 127 (first installation indicator member), and the indicator pins 128 (second installation indicator members) connected to the module base 120. As described above, the indicator pins 128 extend upward from the base 120 and form an inner sleeve received within indicator sleeve 127. The indicator pins 128 may be formed from plastic or other suitably resilient material that allows the pins (arms, claws) to move outward when the pushpin 124 is fully inserted and a head 123 of the pushpin is forced into contact with the pins 128. Thus, the head 123 of the pushpin operates in a similar manner as the outer ring 23 in the installation indicator spring screw module design and the visual indicator surfaces 130, 133 provide a visual indication of the state of the pushpin installation as described above for the installation indicator spring screw module.

Figure 12:
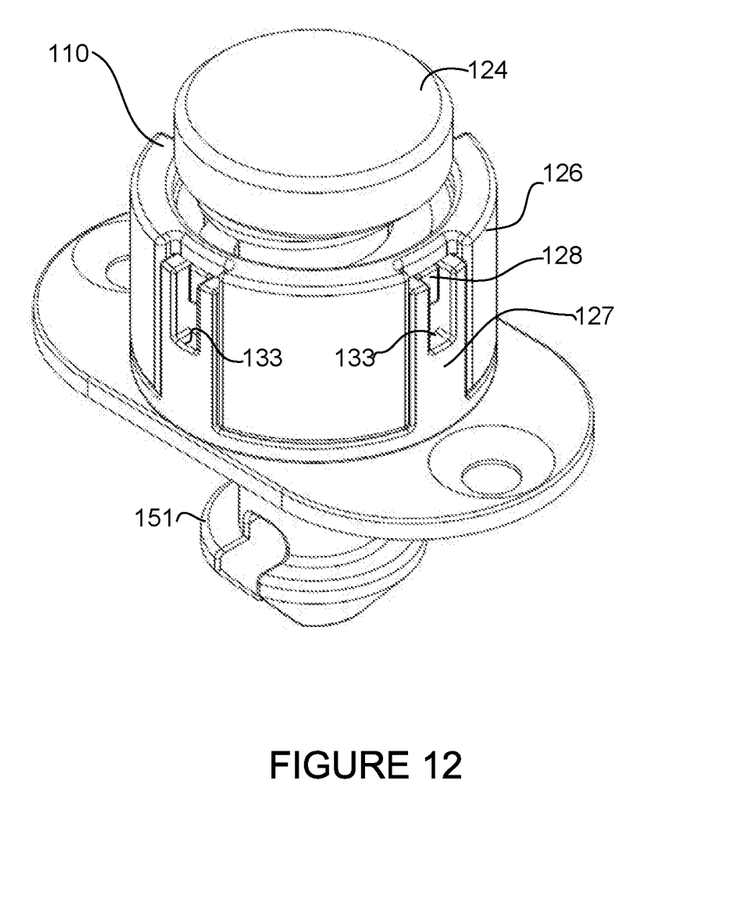
FIG. 12 is a perspective of the installation indicator pushpin module in the uninstalled position.

FIG. 12 is a perspective of the installation indicator pushpin module 110 in the uninstalled state. The pushpin head 123 is not in contact with the indicator pins 128, which are in their unbiased inward position. The upper red surfaces 133 of the indicator sleeve 127 are therefore visible.

Figure 13A:
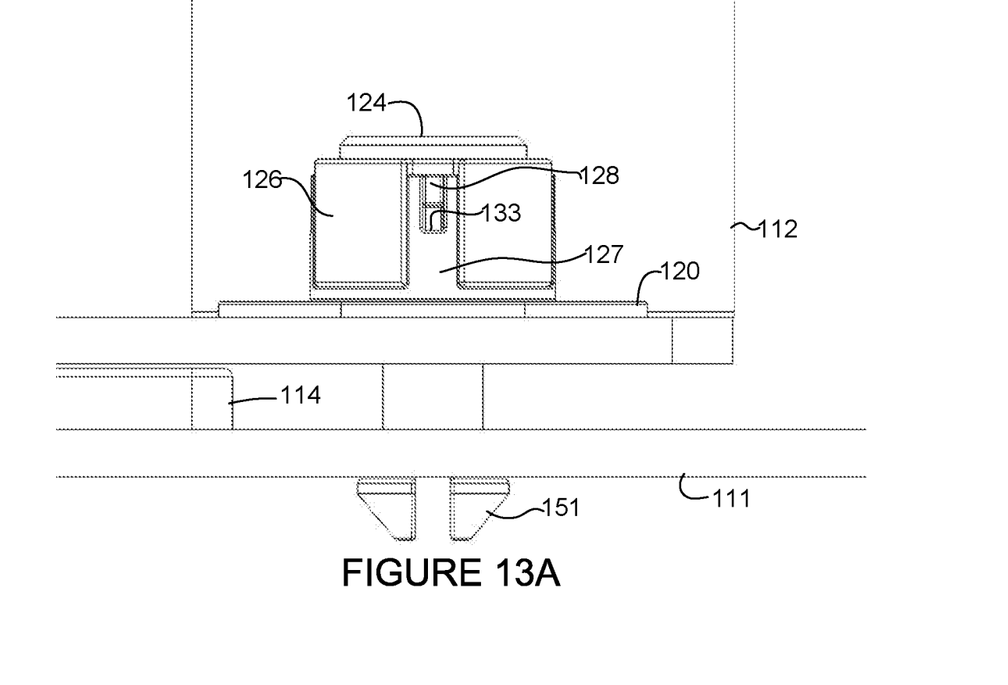
FIG. 13A is a side view of the installation indicator pushpin module fully installed in the processor and heatsink assembly.
Figure 13B:
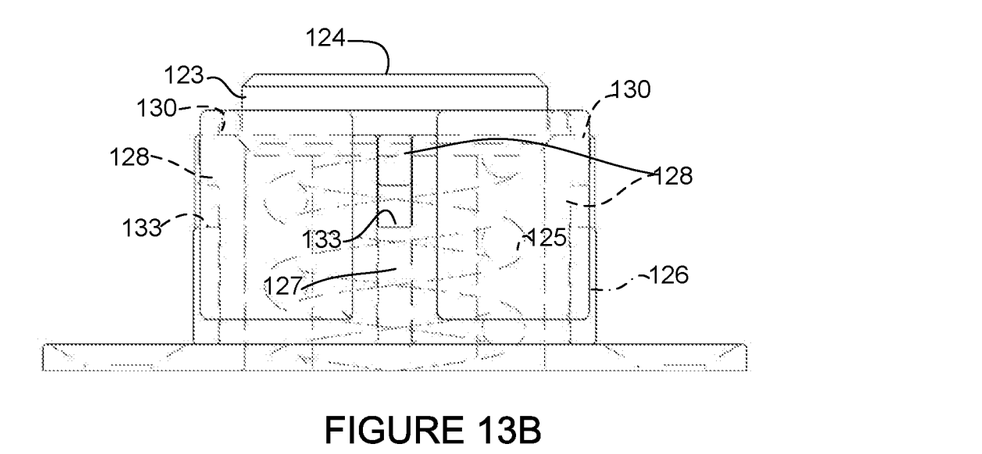
FIG. 13B is the installation indicator pushpin module of FIG. 13A with parts shown in phantom to illustrate additional details of the module.

FIGS. 13A and 13B are side views of the installation indicator pushpin module 110 fully installed with the heatsink 112 attached to the printed circuit board 111. The installation indicator pushpin module 110 does not need a standoff 50 as described above for the installation indicator spring screw module 10. As shown in FIG. 13A, the pushpin 124 includes resilient fingers 151 that may be moved inward when the pushpin is inserted into the opening in the circuit board 111 and expand outward when passed through the opening to hold the heatsink 112 in place.

The outer sleeve 126 is shown in phantom in FIG. 13B to illustrate the position of the indicator pins 128 when the pushpin is fully installed. As the pushpin 124 is inserted into the opening, the head 123 of the pushpin moves downward and into contact with the indicator pins 128, which are forced radially outward by the pushpin head. The upper green surfaces 130 of the indicator pins 128 are now visible as viewed from the top since they extend beyond the upper surface of the outer sleeve 126. When the indicator pin 128 is in its spring loaded position (pushed radially outward), it blocks the red upper surface 133 of the indicator sleeve 127.

It is to be understood that the screw and pushpin described herein are only examples of fasteners and the other suitable fasteners may be used in the installation indicator module, without departing from the scope of the embodiments. Also, any number of modules may be used to install the heatsink and the modules may be positioned at any location on the heatsink. The examples described herein provide visual indication of the installation state of the fastener from a top view of the module, however, visual indication may also be provided from other viewpoints (e.g., side, bottom, or other perspective).

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
   a module for use in installing a heatsink, the module comprising:
   a fastener;
   a first indicator member comprising a first visual indicator surface; and
   a second indicator member comprising a second visual indicator surface, the first indicator member and the second indicator member defining an opening for receiving the fastener,
   wherein the first visual indicator surface is visible from a top view when the fastener is partially installed and the second visual indicator surface is visible when the fastener is fully installed.

2. The apparatus of claim 1 wherein the first visual indicator surface and the second visual indicator surface are different colors and only one of the first visual indicator surface and the second visual indicator surface is visible at a time.

3. The apparatus of claim 1 wherein said first indicator member comprises an indicator sleeve and said second indicator member comprises one or more resilient indicator pins received in the indicator sleeve.

4. The apparatus of claim 1 wherein said second indicator member is forced radially outward when the fastener is fully installed to expose said second visual indicator surface.

5. The apparatus of claim 1 wherein the fastener comprises a spring loaded screw.

6. The apparatus of claim 1 wherein the fastener comprises a spring loaded pushpin.

7. The apparatus of claim 1, wherein the first indicator member is an indicator sleeve and the second indicator member extends upward from a base of the module and forms an inner sleeve received within the indicator sleeve.

8. The apparatus of claim 1, wherein the first indicator member includes an indicator sleeve and the second indicator member includes at least one indicator pin.

9. The apparatus of claim 1, wherein the module further comprises an outer sleeve configured to block the second visual indicator surface from view when the fastener is not fully installed.

10. An apparatus comprising:
    a heatsink; and
    a plurality of modules attached to the heatsink for installation of the heatsink; each of the plurality of modules comprising:
    a fastener;
    a first indicator member comprising a first visual indicator surface; and
    a second indicator member comprising a second visual indicator surface;
    wherein the first visual indicator surface is visible, from a top view, when the fastener is partially installed and the second visual indicator surface is visible when the fastener is fully installed.

11. The apparatus of claim 10, wherein the first visual indicator surface and the second visual indicator surface are different colors and only one of the first visual indicator surface and the second visual indicator surface is visible at a time.

12. The apparatus of claim 10 wherein a head of the fastener forces said second indicator member into a position in which said second visual indicator surface is visible when the fastener is fully installed.

13. The apparatus of claim 10 wherein said second indicator member is forced radially outward when the fastener is fully installed to expose said second visual indicator surface.

14. The apparatus of claim 10, wherein the first indicator member and the second indicator member are received in an outer sleeve and wherein the outer sleeve blocks the second visual indicator surface from view when the fastener is not fully installed.

15. The apparatus of claim 10 wherein the fastener comprises a spring loaded screw.

16. The apparatus of claim 10 wherein the fastener comprises a spring loaded pushpin.

17. The apparatus of claim 10, wherein the first indicator member is an indicator sleeve and the second indicator member extends upward from a base of a respective module and forms an inner sleeve received within the indicator sleeve.

18. The apparatus of claim 10, wherein the first indicator member includes an indicator sleeve and the second indicator member includes at least one indicator pin.

19. The apparatus of claim 10, wherein each of the plurality of modules further comprises an outer sleeve configured to block the second visual indicator surface from view when the fastener is not fully installed.

20. An apparatus comprising:
    a module for use in installing a heatsink, the module comprising:
    a fastener;
    a first indicator member comprising a first visual indicator surface; and
    a second indicator member comprising a second visual indicator surface, the first indicator member and the second indicator member defining an opening for receiving the fastener,
    wherein the first visual indicator surface is visible when the fastener is not fully installed and the second visual indicator surface is visible when the fastener is fully installed, wherein the first indicator member and the second indicator member are received in an outer sleeve, and
wherein the outer sleeve blocks the second visual indicator surface from view when the fastener is not fully installed.

\* \* \* \* \*